(12) United States Patent
Hwang et al.

(10) Patent No.: US 7,952,905 B2
(45) Date of Patent: May 31, 2011

(54) DATA STORAGE DEVICE USING MAGNETIC DOMAIN WALL MOVEMENT AND METHOD OF OPERATING THE SAME

(75) Inventors: In-jun Hwang, Yongin-si (KR); Young-jin Cho, Suwon-si (KR); Sung-hoon Choa, Seoul (KR); Kee-won Kim, Yongin-si (KR); Kwang-seok Kim, Busan (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 877 days.

(21) Appl. No.: 11/764,432

(22) Filed: Jun. 18, 2007

(65) Prior Publication Data

US 2008/0137395 A1 Jun. 12, 2008

(30) Foreign Application Priority Data

Nov. 6, 2006 (KR) .................. 10-2006-0109072

(51) Int. Cl.
*G11C 19/00* (2006.01)
(52) U.S. Cl. ............... 365/80; 365/88; 365/171
(58) Field of Classification Search ............ 365/80, 365/87, 88, 158, 171, 173
See application file for complete search history.

(56) References Cited

U.S. PATENT DOCUMENTS

| | | | | |
|---|---|---|---|---|
| 7,031,178 B2 * | 4/2006 | Parkin | | 365/80 |
| 7,450,327 B2 * | 11/2008 | Yang et al. | | 360/31 |
| 7,782,663 B2 * | 8/2010 | Kim | | 365/171 |
| 7,855,908 B2 * | 12/2010 | Joe et al. | | 365/85 |
| 7,864,556 B2 * | 1/2011 | Lim et al. | | 365/81 |
| 2004/0252539 A1 | 12/2004 | Parkin | | |
| 2006/0120132 A1 | 6/2006 | Parkin | | |
| 2006/0237808 A1 | 10/2006 | Saito | | |
| 2007/0087454 A1 * | 4/2007 | Chen et al. | | 438/3 |
| 2008/0137395 A1 * | 6/2008 | Hwang et al. | | 365/80 |
| 2008/0138659 A1 * | 6/2008 | Lim et al. | | 428/810 |
| 2010/0208381 A1 * | 8/2010 | Kim et al. | | 360/69 |
| 2010/0208504 A1 * | 8/2010 | Kim et al. | | 365/80 |

OTHER PUBLICATIONS

European Office Action (dated Mar. 26, 2008) for counterpart European Patent Application No. 07114970.2-2210 is provided for the purposes of certification under 37 C.F.R. §§ 1.97(e) and 1.704(d).

* cited by examiner

*Primary Examiner* — Gene N. Auduong
(74) *Attorney, Agent, or Firm* — Harness, Dickey & Pierce, P.L.C.

(57) ABSTRACT

Provided are a data storage device using magnetic domain wall movement and a method of operating the data storage device. The data storage device includes a first magnetic layer for writing data having two magnetic domains magnetized in opposite directions to each other and a second magnetic layer for storing data formed on at least one side of the first magnetic layer. The data storage device may further include a data recording device connected to both ends of the first magnetic layer and the end of the second magnetic layer which is not adjacent to the first magnetic layer, a read head formed a predetermined distance from the end of the second magnetic layer which is not adjacent to the first magnetic layer, and a current detector connected to the read head and the data recording device.

23 Claims, 16 Drawing Sheets

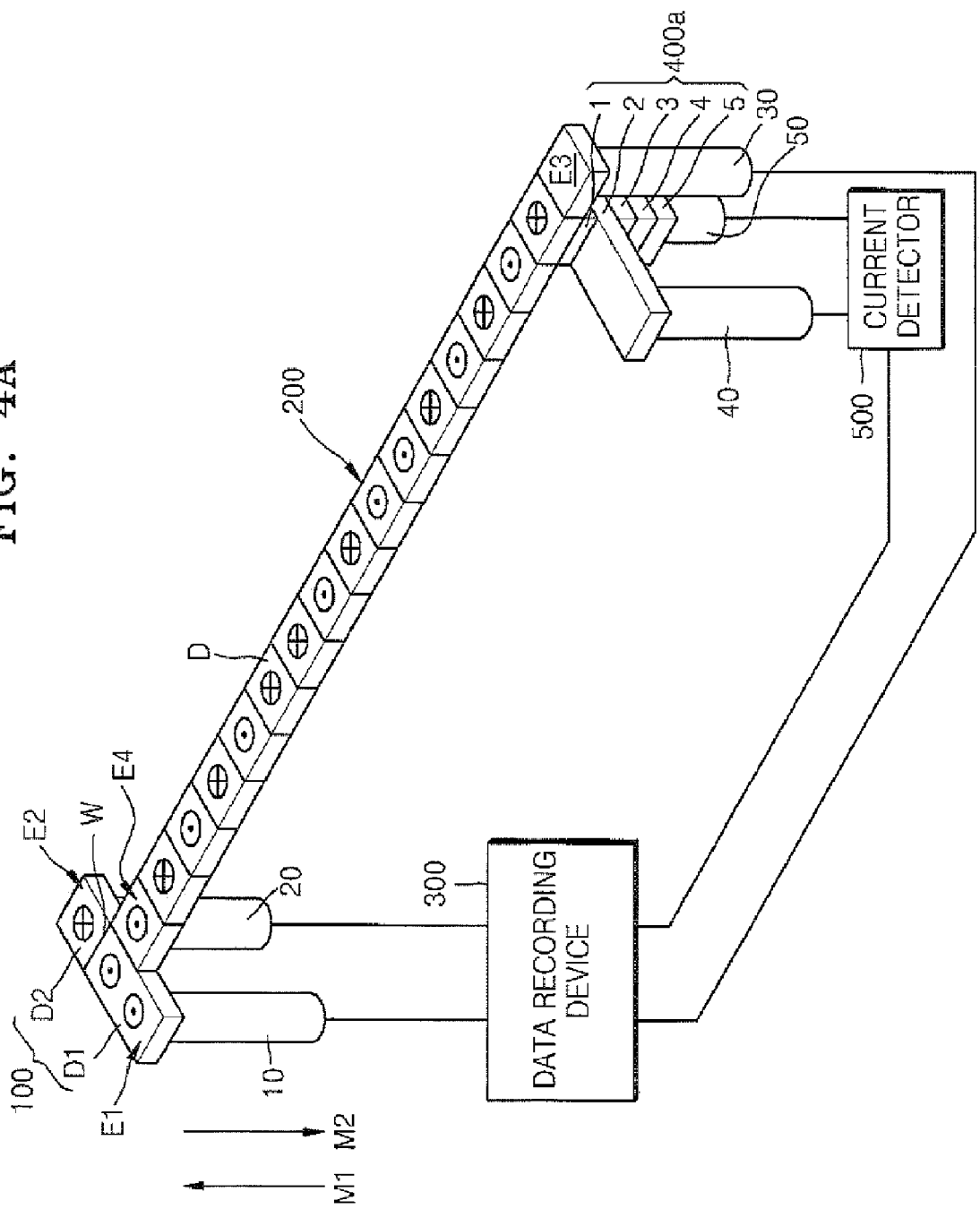

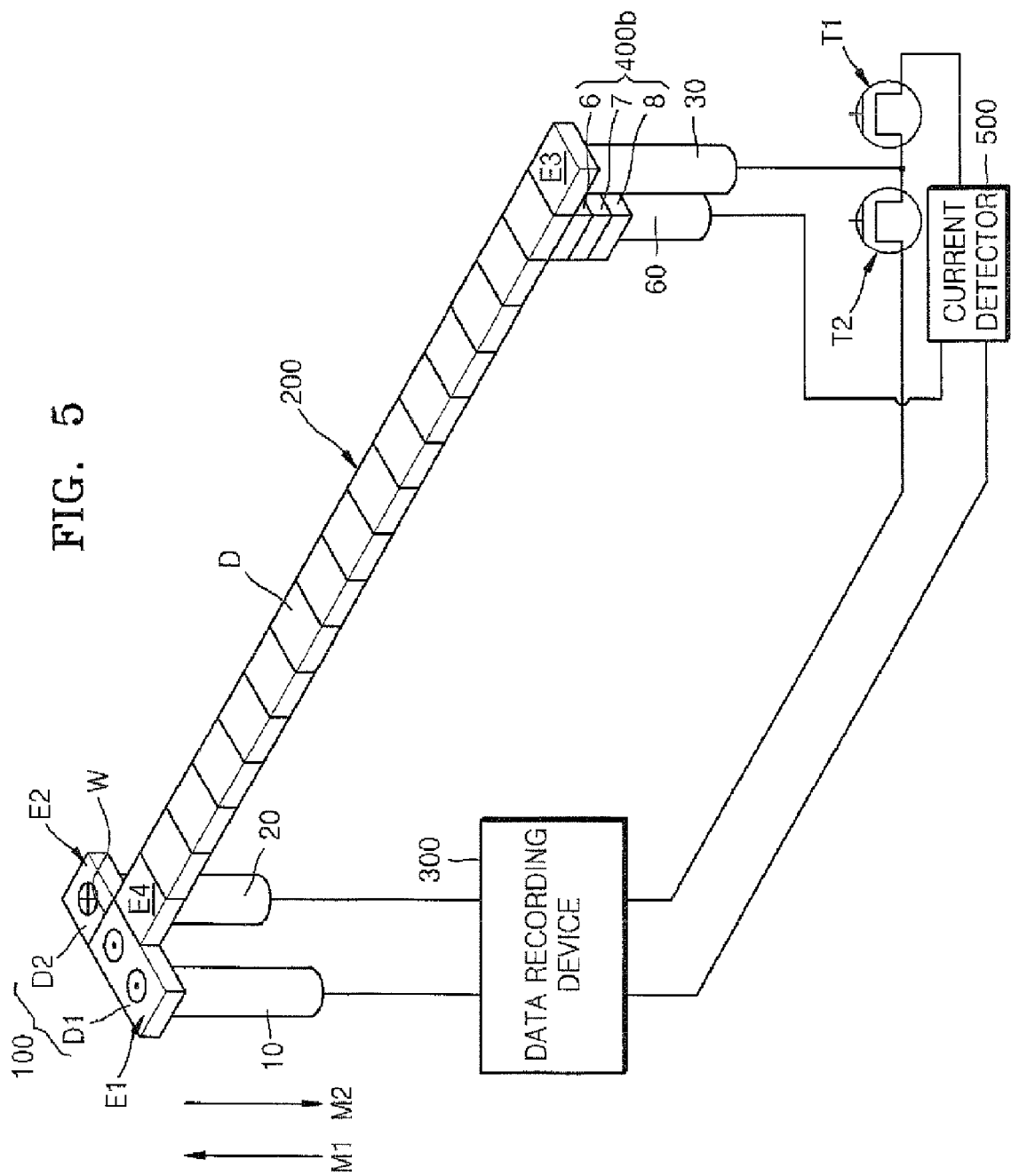

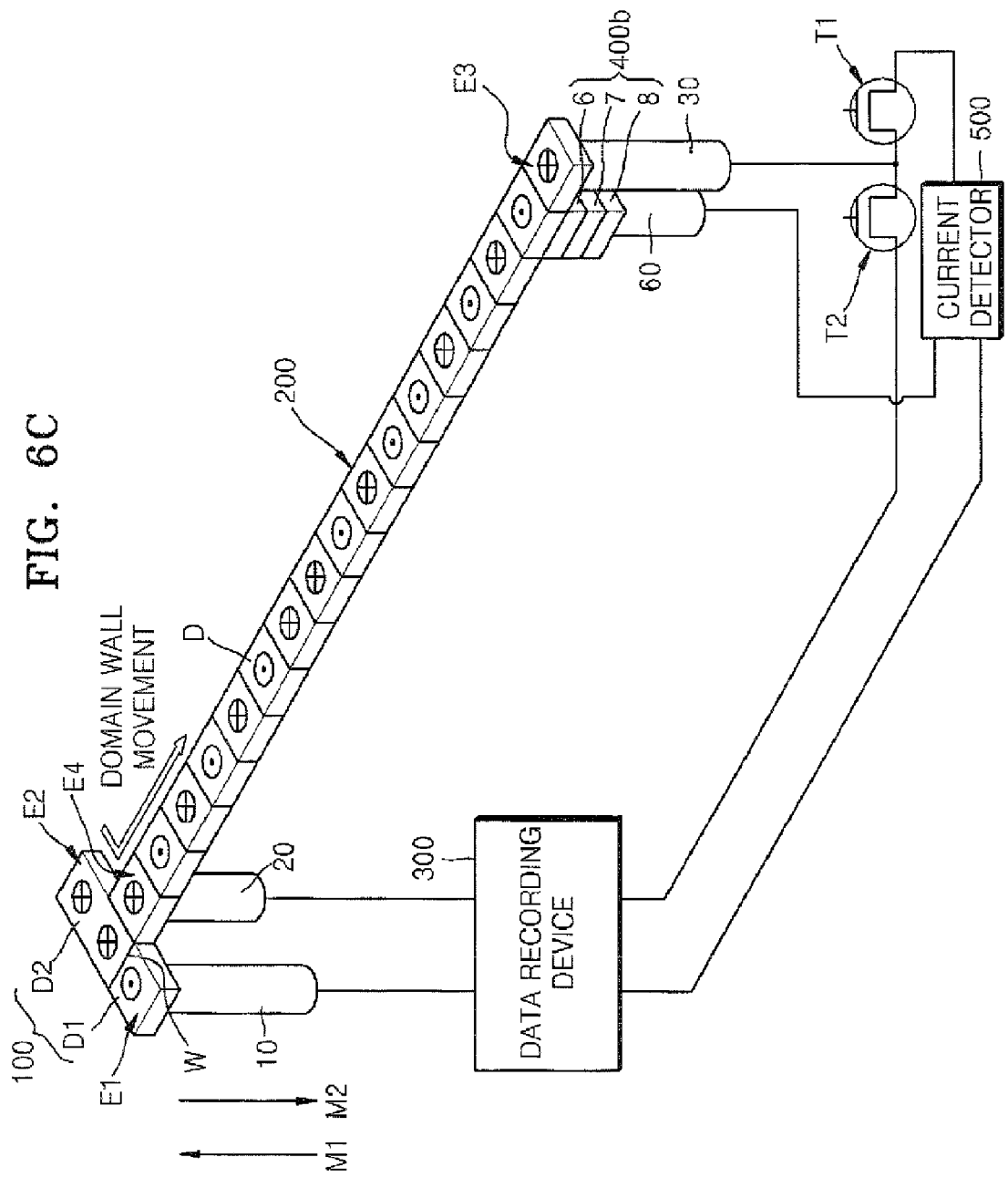

DATA STORAGE DEVICE USING MAGNETIC DOMAIN WALL MOVEMENT AND METHOD OF OPERATING THE SAME

CROSS-REFERENCE TO RELATED PATENT APPLICATION

This application claims the benefit of Korean Patent Application No. 10-2006-0109072, filed on Nov. 6, 2006, in the Korean Intellectual Property Office, the disclosure of which is incorporated herein in its entirety by reference.

BACKGROUND OF THE INVENTION

1. Field of the Invention

The present invention relates to a data storage device, and more particularly, to a data storage device using magnetic domain wall movement in a magnetic material and a method of operating the data storage device.

2. Description of the Related Art

A minute magnetic region that constitutes a ferromagnetic body is referred to as a magnetic domain. The rotation of all electrons in a magnetic domain, that is, the direction of their magnetic moments, is identical. The size and magnetization direction of a magnetic domain can be appropriately controlled by the property, shape and size of a magnetic substance and external energy.

A magnetic domain wall is a boundary portion between magnetic domains having different magnetization directions. The magnetic domain wall can be moved by an external magnetic field or by a current applied to a magnetic substance. That is, a plurality of magnetic domains having a specific magnetization direction can be formed in a magnetic layer having a predetermined width and thickness, and the magnetic domains and magnetic domain walls can be moved using a magnetic field or a current having an appropriate strength.

The principle of the magnetic domain wall movement can be applied to data storage devices. For example, when magnetic domains pass through a read/write head by movement of the magnetic domain wall, an operation of reading/writing data is possible without physical movement, e.g. rotating, of a recording medium. Accordingly, data storage devices, to which the principle of the magnetic domain wall movement is applied, do not require a word line for designating a cell, in which data is read (or written), unlike a usual random access memory (RAM), and it is not necessary to rotate a recording medium of such data storage devices unlike a hard disk drive (HDD). Since data storage devices using a magnetic domain wall movement have relatively simple structures and small bit sizes, a very large storage capacity of more than 1 tera bytes can be achieved.

However, since such data storage devices are in the first stage of development, several problems should be addressed so that these data storage devices may be put to practical use. In particular, there is a need to develop a method of recording data for practical use in a data storage device using the magnetic domain wall movement. Hereinafter, the problems of a writing operation in a conventional data storage device using a magnetic domain wall movement (hereinafter, referred to as a conventional writing operation) will be described.

The conventional writing operation can be classified into a method using an external magnetic field and a method using a spin torque phenomenon of electrons. The method using the spin torque phenomenon of electrons can be classified into a method using a giant magneto resistance (GMR) and a method using a tunnel magneto resistance (TMR).

The method using the external magnetic field can not be applied when a magnetic layer has great magnetic anisotropic energy, which means that a data storage device having good properties and high recording density can not be realized using the method using the external magnetic field.

In the method using the spin torque phenomenon of electrons, it is difficult to perform a writing operation when the thickness of a magnetic layer, in which data is to be recorded, is more than a predetermined thickness (i.e., about 3 nm). Accordingly, the method using the spin torque phenomenon of the electrons can not be applied to a perpendicular magnetic recording method requiring a magnetic layer having a thickness more than 100 nm. A TMR or GMR write head has a stack structure in which a ferromagnetic layer (a pinned layer), a separation layer (an insulating layer or a conductive layer) and a magnetic layer, in which data is to be recorded, are sequentially stacked. In a stacking process, since a surface of the separation layer may be damaged by etching, the properties of writing operations may deteriorate. In addition, since forming of the TMR or GMR write head requires multi-layer thin film processes, it is difficult to fabricate the TMR or GMR write head.

Accordingly, there is a need to develop a writing operation which is not limited by the properties and the dimensions of the magnetic layer, in which data is to be recorded, wherein the operation characteristics of writing operations are fundamentally prevented from deteriorating by a separation layer becoming damaged.

In addition, there is a need to develop a data storage device comprising a read head performing appropriate reading operations in connection with the above new writing method and a means for moving a magnetic domain wall.

SUMMARY OF THE INVENTION

The present invention provides a data storage device including a data recording device, which is not limited by the properties and the dimensions of a magnetic layer in which data is to be recorded, wherein the operational characteristics of the data storage device are fundamentally prevented from deteriorating due to etching damage.

The present invention also provides a method of operating the data storage device.

According to an aspect of the present invention, there is provided a data storage device comprising: a first magnetic layer which writes data comprising two magnetic domains magnetized in opposite directions to each other; and a second magnetic layer which stores data formed on at least one side of the first magnetic layer.

The data storage device may further comprise: a data recording device connected to both ends of the first magnetic layer and the end of the second magnetic layer which is not adjacent to the first magnetic layer; a read head disposed a predetermined distance from the end of the second magnetic layer which is not adjacent to the first magnetic layer; and a current detector connected to the read head and the data recording device.

The read head may be disposed on a portion of the second magnetic layer close to the end of the second magnetic layer.

The read head may comprise an insulating layer, an electrode layer, a ferromagnetic free layer, a separation layer and a ferromagnetic pinned layer which are sequentially formed on a lower surface of the second magnetic layer.

The electrode layer and the ferromagnetic pinned layer may be connected to the current detector.

The read head may comprise a ferromagnetic free layer, a separation layer and a ferromagnetic pinned layer which are sequentially formed on a lower surface of the second magnetic layer.

The ferromagnetic pinned layer and the end of the second magnetic layer may be connected to the current detector.

A switching device may be disposed each between the end of the second magnetic layer and the current detector and between the end of the second magnetic layer and the data recording device.

The data recording device may comprise a current controller.

The data recording device may comprise a voltage controller.

A plurality of second magnetic layers may be formed, and the plurality of second magnetic layers may be formed at regular intervals.

A plurality of first magnetic layers may have a stacked structure and each of the first magnetic layers may have a plurality of second magnetic layers formed thereon.

The first and second magnetic layers may be the same material.

The first magnetic layer may satisfy the condition of the farther from the center of the first magnetic layer, the greater the width of at least one of the ends of the first magnetic layer.

One of the ends of the first magnetic layer may have a greater width than the remaining region except for the ends of the first magnetic layer.

The ends of the first magnetic layer may have different sizes.

The ends of the first magnetic layer may have different sizes.

The data storage device may further comprise an antiferromagnetic (AFM) layer formed on one end of the first magnetic layer.

The data storage device may further comprise first and second AFM layers formed on either end of the first magnetic layer and having different Neel temperatures $T_N$s.

The data storage device may further comprise a non-magnetic layer, a ferromagnetic pinned layer and a first AFM layer which are sequentially disposed on an end of the first magnetic layer, and a second AFM layer formed on the other end of the first magnetic layer.

According to another aspect of the present invention, there is provided a method of operating a data storage device comprising a first magnetic layer for writing data comprising two magnetic domains magnetized in opposite directions to each other and a second magnetic layer for storing data formed on a side of the first magnetic layer, the method comprising: extending one of the magnetic domains of the first magnetic into a part of the first magnetic layer which contacts the second magnetic layer; and moving the magnetic domain of the part of the first magnetic layer which contacts the second magnetic layer, into the second magnetic layer by a distance which corresponds to the length of one bit.

The extending may be performed by flowing a current between both ends of the first magnetic layer, and the moving may be performed by flowing a current from the second magnetic layer to the first magnetic layer.

According to another aspect of the present invention, there is provided a method of operating a data storage device comprising a first magnetic layer for writing data comprising two magnetic domains magnetized in opposite directions to each other, a second magnetic layer for storing data formed on a side of the first magnetic layer, a data recording device connected to both ends of the first magnetic layer and the end of the second magnetic layer which is not adjacent to the first magnetic layer, a read head formed a predetermined distance from the end of the second magnetic layer which is not adjacent to the first magnetic layer, and a current detector connected to the read head and the data recording device, the method comprising: reading data recorded at the end of the second magnetic layer which is not adjacent to the first magnetic layer using the read head and the current detector; and recording data read in the reading of the data at the other end of the second magnetic layer using the data recording device.

The recording may comprise extending one of the magnetic domains of the first magnetic layer to a part of the first magnetic layer which contacts the second magnetic layer; and moving a magnetic domain of the part of the first magnetic layer which contacts the second magnetic layer, into the second magnetic layer by a distance which corresponds to the length of one bit.

BRIEF DESCRIPTION OF THE DRAWINGS

The above and other features and advantages of the present invention will become more apparent by describing in detail exemplary embodiments thereof with reference to the attached drawings in which:

FIGS. 4A through 4C are perspective views illustrating a reading operation of the data storage device of FIG. 3, according to an embodiment of the present invention;

FIG. 5 is a perspective view illustrating a data storage device according to another embodiment of the present invention;

FIGS. 6A through 6C are perspective views illustrating a reading operation of the data storage device of FIG. 5, according to another embodiment of the present invention;

DETAILED DESCRIPTION OF THE INVENTION

Figure 1:
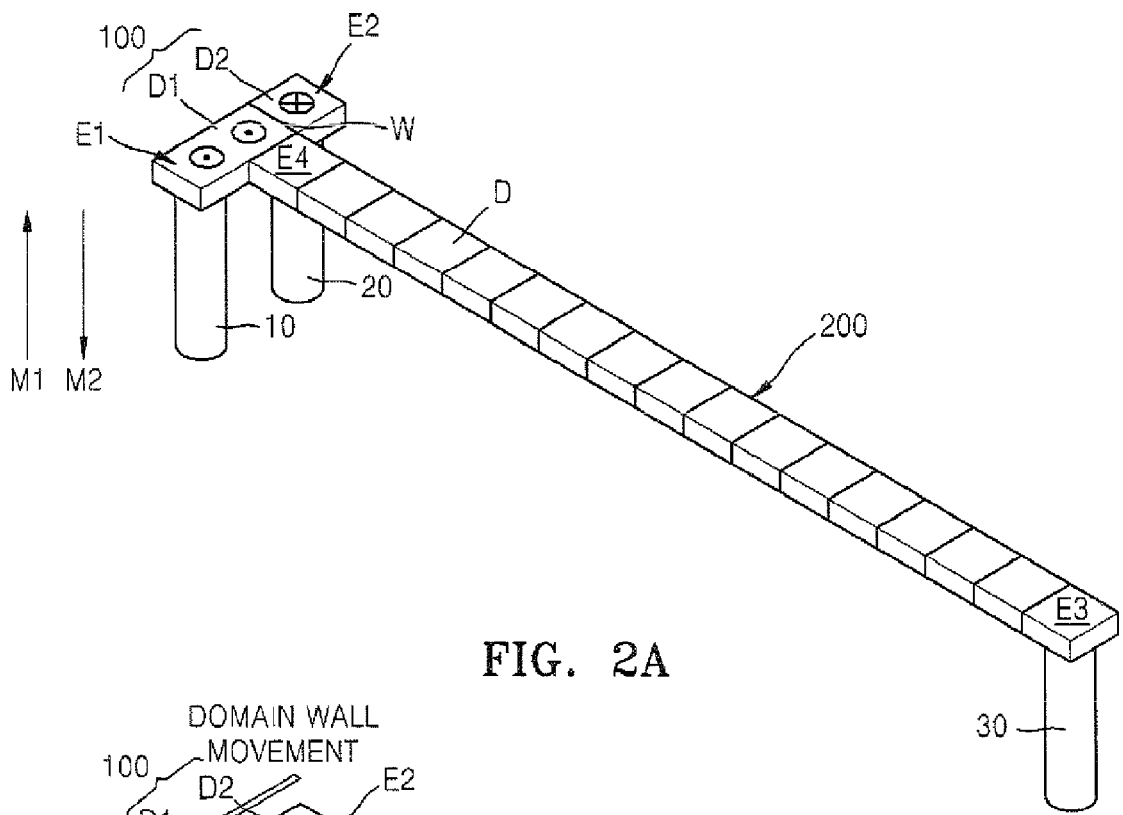
FIG. 1 is a partial perspective view illustrating a data storage device according to an embodiment of the present invention.

The present invention will now be described more fully with reference to the accompanying drawings, in which exemplary embodiments of the invention are shown. In the drawings, the thicknesses of layers and regions are exaggerated for clarity.

FIG. 1 is a partial perspective view illustrating a data storage device according to an embodiment of the present invention (hereinafter, referred to as 'the data storage device'). Referring to FIG. 1, the data storage device includes a first magnetic layer 100 for writing including two magnetic domains, that is, first and second magnetic domains D1 and D2 which are magnetized in opposite directions to each other. A mark ⊙ indicates magnetization in a first direction 'M1', and a mark ⊗ indicates magnetization in a second direction 'M2'. These marks ⊙ and ⊗ have the same meaning in other drawings.

First and second contact plugs 10 and 20 for electrically connecting the first magnetic layer 100 to a lower structure (not shown) are respectively formed on lower surfaces of ends E1 and E2 of the first magnetic layer 100.

When a current is supplied to the first magnetic layer 100 through the first and second contact plugs 10 and 20, a magnetic domain wall 'W' which is a boundary of the first and second magnetic domains D1 and D2 can be moved in the first magnetic layer 100. According to a moving direction of the magnetic domain wall 'W', the sizes of the first and second magnetic domains D1 and D2 are determined. When the current flows from one end E1 to the other end E2 of the first magnetic layer 100, since electrons move from the end E2 to the end E1, the magnetic domain wall 'W' is moved in the same direction as that of the electrons. FIG. 1 illustrates the case where the magnetic domain wall 'W' is moved to be closer to the end E2 of the first magnetic layer 100.

A second magnetic layer 200 for storing data, which is perpendicular to the first magnetic layer 100 and includes a plurality of magnetic domains D, is disposed on at least one side surface of the first magnetic layer 100. Each of the magnetic domains D is a unit area, that is, a unit bit area in which predetermined data can be stored.

The first and second magnetic layers 100 and 200 are simultaneously formed of a metal including at least one of Ni, Fe and Co. A third contact plug 30 for electrically connecting to another lower structure (not shown) is formed on a lower surface of the end E3 of the second magnetic layer 200 which is not adjacent to the first magnetic layer 100.

A current can be supplied between the first and second magnetic layers 100 and 200 through one of the first and second contact plugs 10 and 20 and the third contact plug 30. For example, when a current is supplied from the third contact plug 30 to the first contact plug 10, a magnetic domain of a part of the first magnetic layer 100, which contacts the second magnetic layer 200, can be moved into the second magnetic layer 200. In other words, the magnetic domain of the part of the first magnetic layer 100, which contacts the second magnetic layer 200, can be extended into the second magnetic layer 200. As illustrated in FIG. 1, when the magnetic domain of the part of the first magnetic layer 100, which contacts the second magnetic layer 200, is the first magnetic domain D1, data corresponding to the first magnetic domain D1 is recorded at an end E4 of the second magnetic layer 200. When the magnetic domain of the part of the first magnetic layer 100, which contacts the second magnetic layer 200, is the second magnetic domain D2, data corresponding to the second magnetic domain D2 is recorded in the end E4 of the second magnetic layer 200. Here, the current is a pulse current, and a magnetic domain is moved by one bit.

Hereinafter, referring to FIGS. 2A through 2D, a writing operation of the data storage device of FIG. 1 will be described in detail.

FIGS. 2A through 2D are views illustrating a writing operation of the data storage device of the present invention of FIG. 1, according to an embodiment of the present invention.

Figure 2A:
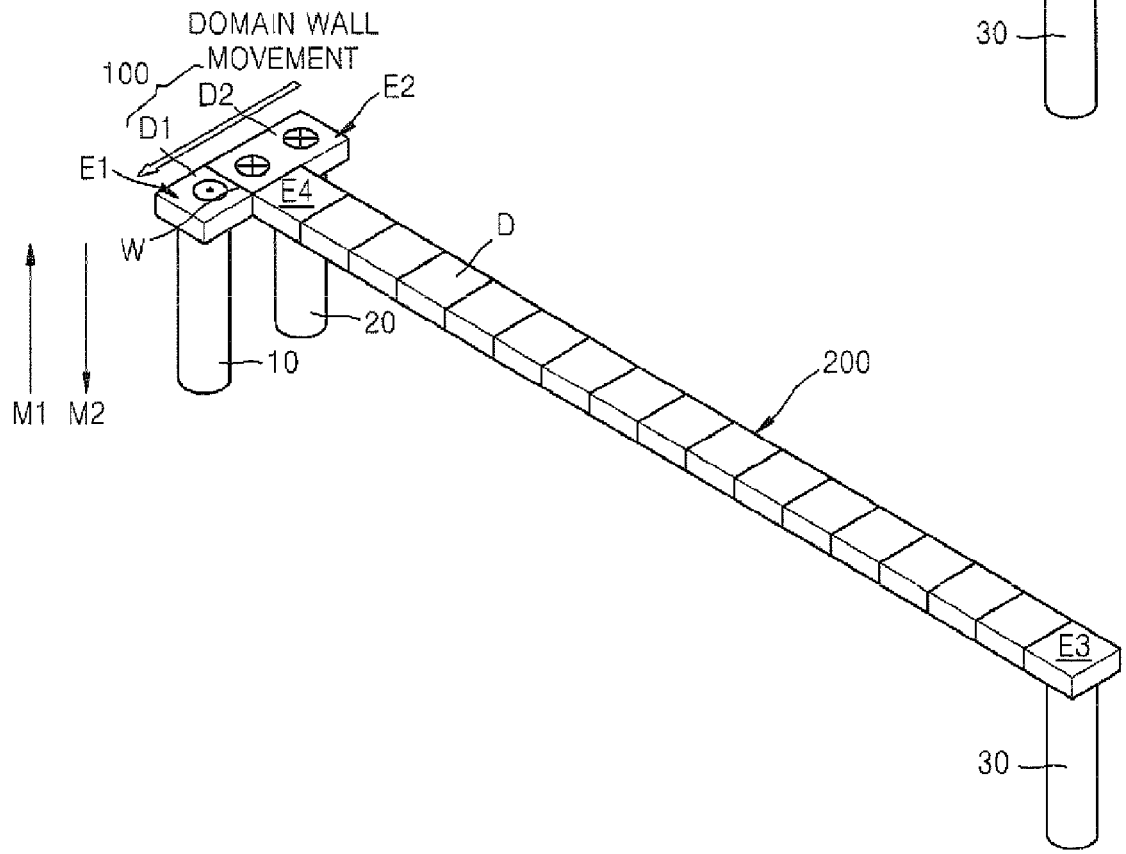
FIGS. 2A through 2D are perspective views illustrating a writing operation of the data storage device of the present invention of FIG. 1, according to an embodiment of the present invention.

Referring to FIG. 2A, a current flows from one end E1 to the other end E2 of a first magnetic layer 100 of the data storage device of FIG. 1, and as such a magnetic domain wall 'W' is moved from the end E2 to the end E1 of the first magnetic layer 100. Accordingly, a second magnetic domain D2 extends to a part of the first magnetic layer 100 which contacts the second magnetic layer 200.

Figure 2B:
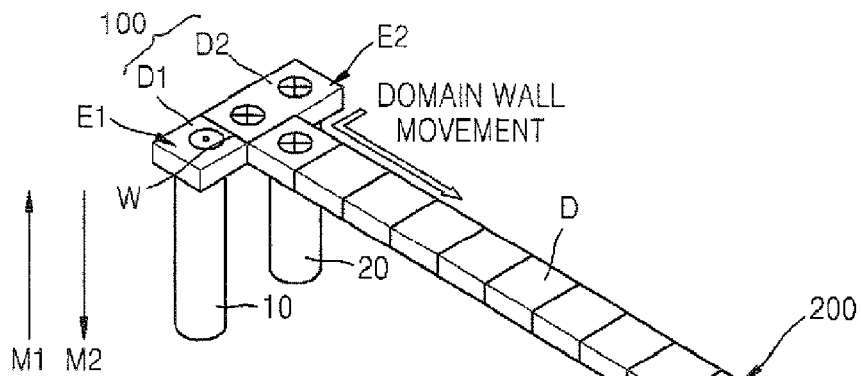

Referring to FIG. 2B, a pulse current flows from one end E3 of the second magnetic layer 200 to the other end E2 of the first magnetic layer 100, and as such a magnetic domain of the part of the first magnetic layer 100 which contacts the second magnetic layer 200, extends into the end E4 of the second magnetic layer 200. Accordingly, data corresponding to the second magnetic domain D2 (e.g., '1') is recorded at the end E4 of the second magnetic layer 200.

Figure 2C:
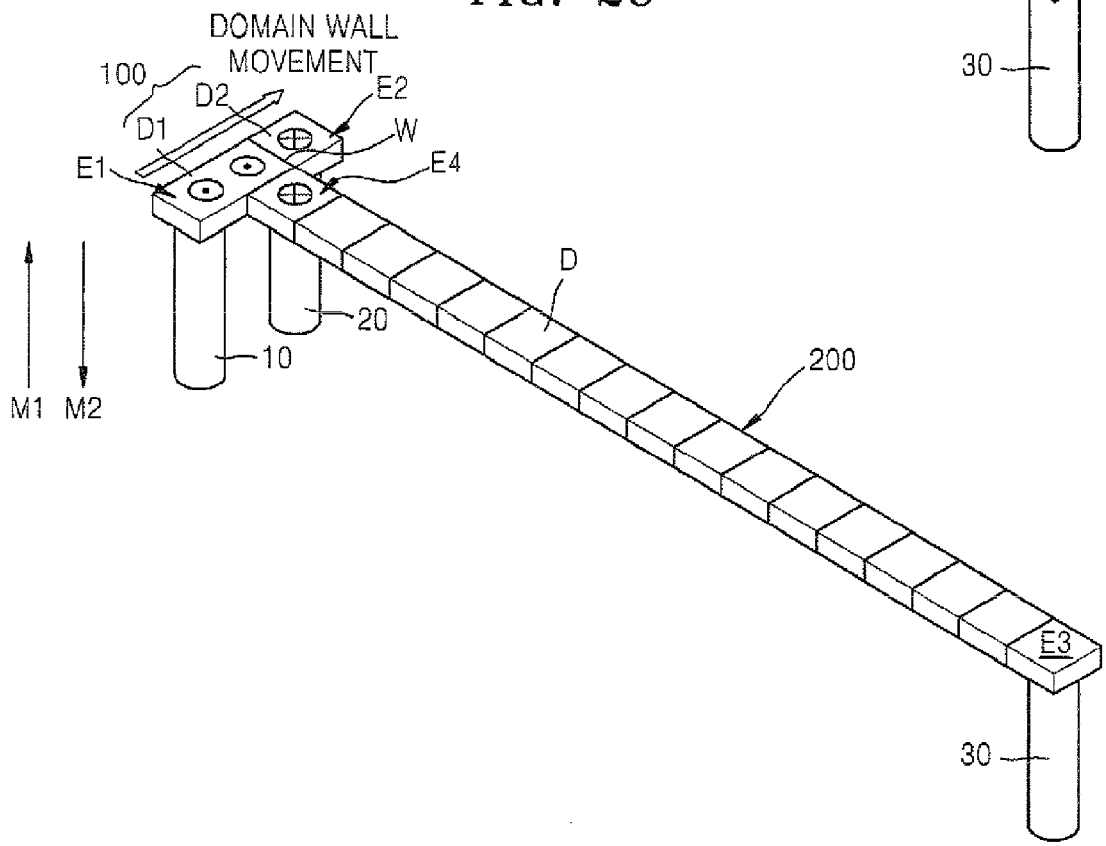

Referring to FIG. 2C, a current flows from the end E2 to the end E1 of the first magnetic layer 100 of the data storage device, and as such the magnetic domain wall 'W' is moved from the end E1 to the end E2 of the first magnetic layer 100. Accordingly, the first magnetic domain D1 extends to the part of the first magnetic layer 100 which contacts the second magnetic layer 200.

Figure 2D:
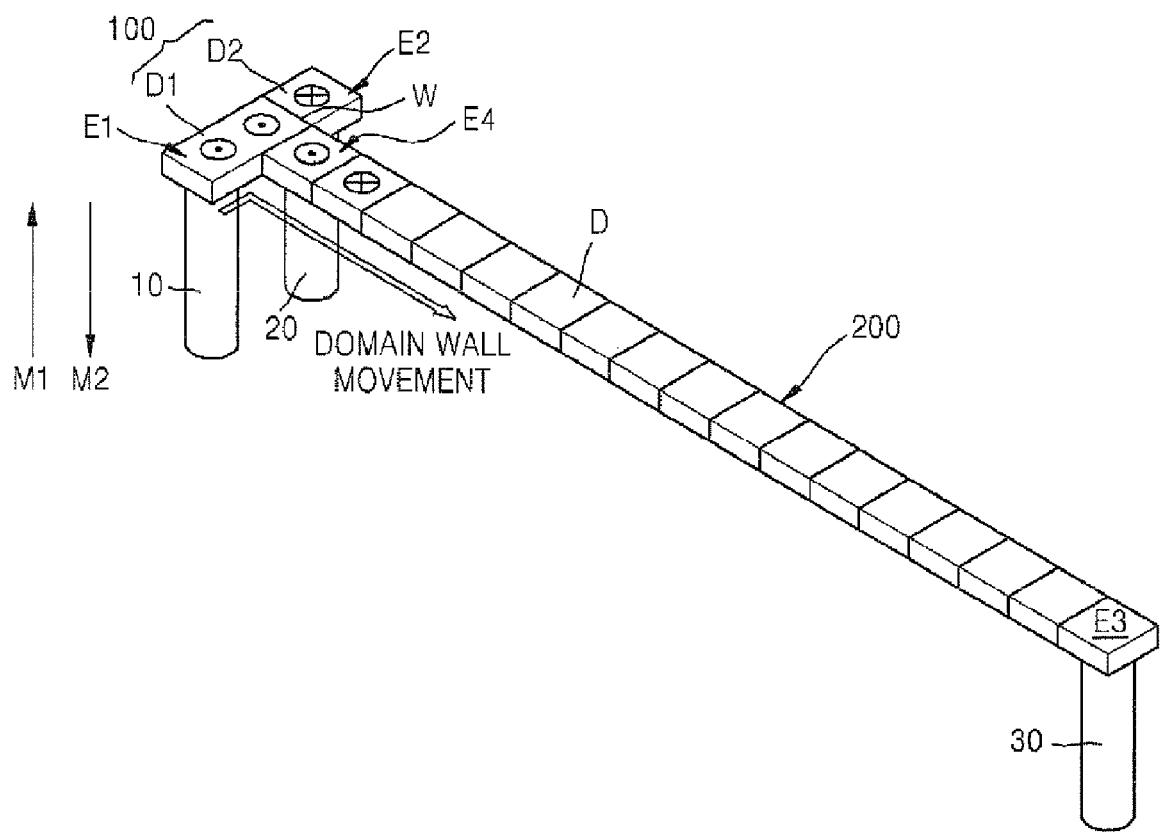

Referring to FIG. 2D, a pulse current flows from the end E3 of the second magnetic layer 200 to the end E1 of the first magnetic layer 100, and then the magnetic domain of the part of the first magnetic layer 100 which contacts the second magnetic layer 200, extends into the other end E4 of the second magnetic layer 200. Accordingly, data corresponding to the first magnetic domain D1 (e.g., '0') is recorded at the end E4 of the second magnetic layer 200.

As described above, in the data storage device, data is recorded using a method in which the magnetic domain walls are appropriately moved in the second magnetic layer 200, in which data is to be stored, and the first magnetic layer 100 for writing data is formed on the same layer as the second magnetic layer 200. A writing operation using such magnetic domain wall movement is performed in the same layer using a relatively simple method in which the flow of the current is accordingly controlled. Accordingly, the writing operation of the data storage device is not limited by the properties and the dimensions of the magnetic layer in which data is to be stored. In addition, the operating characteristics of the data storage device are fundamentally prevented from deteriorating due to etching damage.

Figure 3:
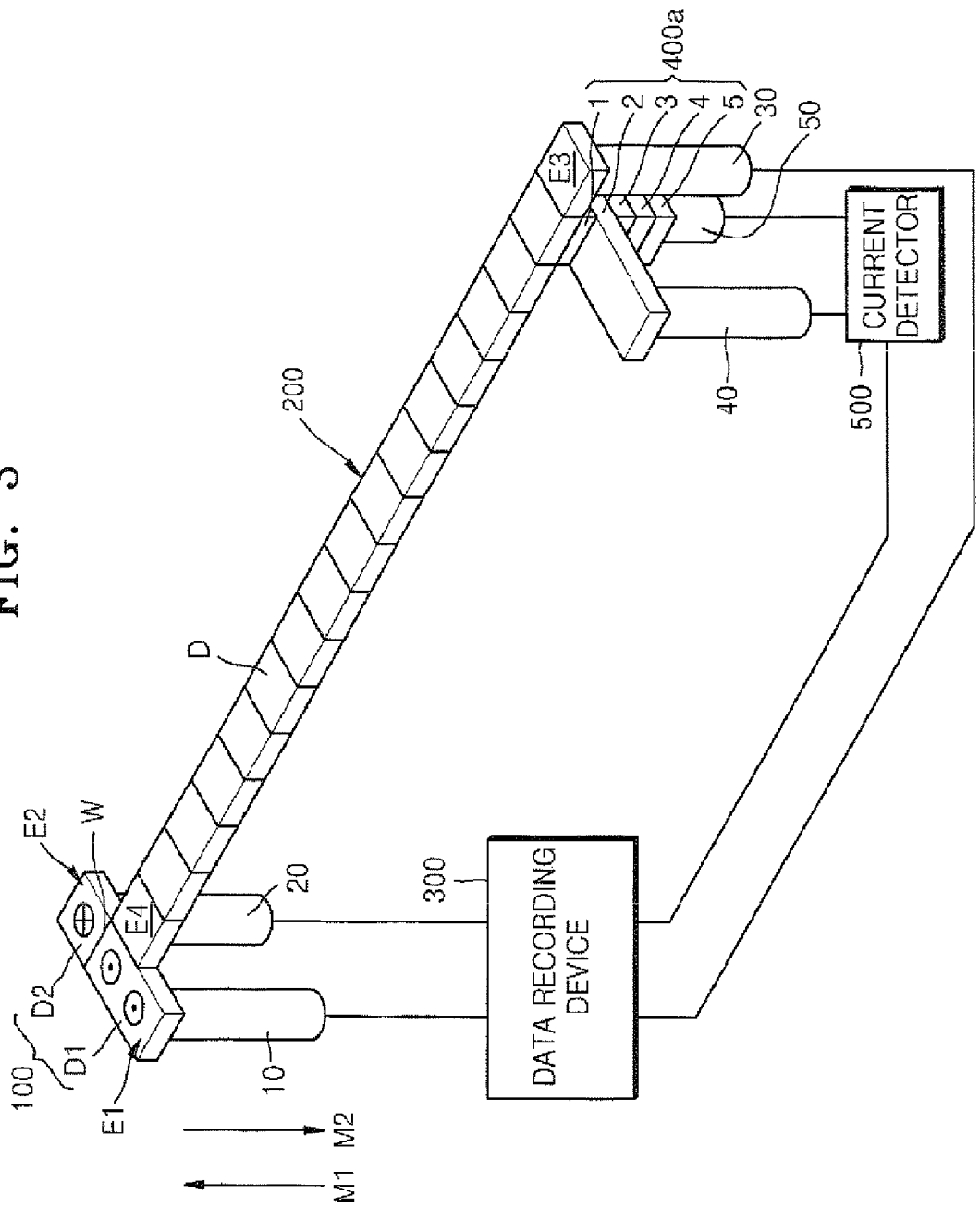
FIG. 3 is a perspective view illustrating a data storage device according to another embodiment of the present invention.

The data storage device may further include a read head performing a reading operation appropriate for the writing operation using magnetic domain wall movement and a data writing element disposed between the read head and the first magnetic layer 100. That is, various elements having various shapes may be connected to the structure illustrated in FIG. 1. FIG. 3 illustrates a data storage device in which various elements are connected to the structure of FIG. 1, according to another embodiment of the present invention.

FIG. 3 is a perspective view illustrating a data storage device including a read head and a data recording device (hereinafter, referred to as 'first data storage device'), according to another embodiment of the present invention. The first data storage device is the data storage device according to the current embodiment of the present invention illustrated in FIG. 1 further including several other elements. Like reference numerals in FIGS. 1 and 3 denote like elements, and thus their description will be omitted.

Referring to FIG. 3, the first data storage device includes a data recording device 300 connected to both ends E1 and E2 of the first magnetic layer 100 and one end E3 of the second magnetic layer 200. The data recording device 300 may include a current controller or a voltage controller. A read head 400a is disposed on the end E3 of the second magnetic layer 200. The read head 400a may include an insulating layer 1, an electrode layer 2, a ferromagnetic free layer 3, a separation layer 4 and a ferromagnetic pinned layer 5 which are sequentially formed on a lower surface of the second magnetic layer 200. The separation layer 4 may be an insulating layer or a conductive layer, preferably, an insulating layer. Stack layers, such as the ferromagnetic free layer 3, the separation layer 4 and the ferromagnetic pinned layer 5, are formed to have the same width as that of a single magnetic domain of the second magnetic layer 200. The electrode layer 2 for electrically contacting is formed to extend out of the stack layers. The insulating layer 1 may be formed to have the same size as the electrode layer 2 or each of the stack layers.

Although not illustrated, an anti-ferromagnetic (AFM) layer and an electrode layer, or alternatively, a non-magnetic layer, a ferromagnetic pinned layer, an AFM layer and an electrode layer may be sequentially formed on a lower surface of the ferromagnetic pinned layer 5. The AFM layer fixes the magnetization direction of the ferromagnetic pinned layer 5.

The first data storage device further includes a current detector 500 connected between the data recording device 300 and the read head 400a. The electrode layer 2 and the ferromagnetic pinned layer 5 of the read head 400a are connected to the current detector 500 through fourth and fifth contact plugs 40 and 50 which are respectively disposed on lower surfaces of the electrode layer 2 and the ferromagnetic pinned layer 5. The current detector 500 is a device which includes an amplifying element such as a sense amplifier (S/A), reads data recorded in the second magnetic layer 200, and transfers information about the read data to the data recording device 300.

Hereinafter, referring to FIGS. 4A through 4C, a reading operation of the data storage device of FIG. 3 will be described.

Referring to FIG. 4A, after predetermined data is recorded in the second magnetic layer 200, data recorded in a magnetic domain can be read. For example in FIG. 4A, a magnetic domain having the ⊗ magnetization direction is read using the read head 400a and the current detector 500. Information about the read data is input to the data recording device 300.

Figure 4B:
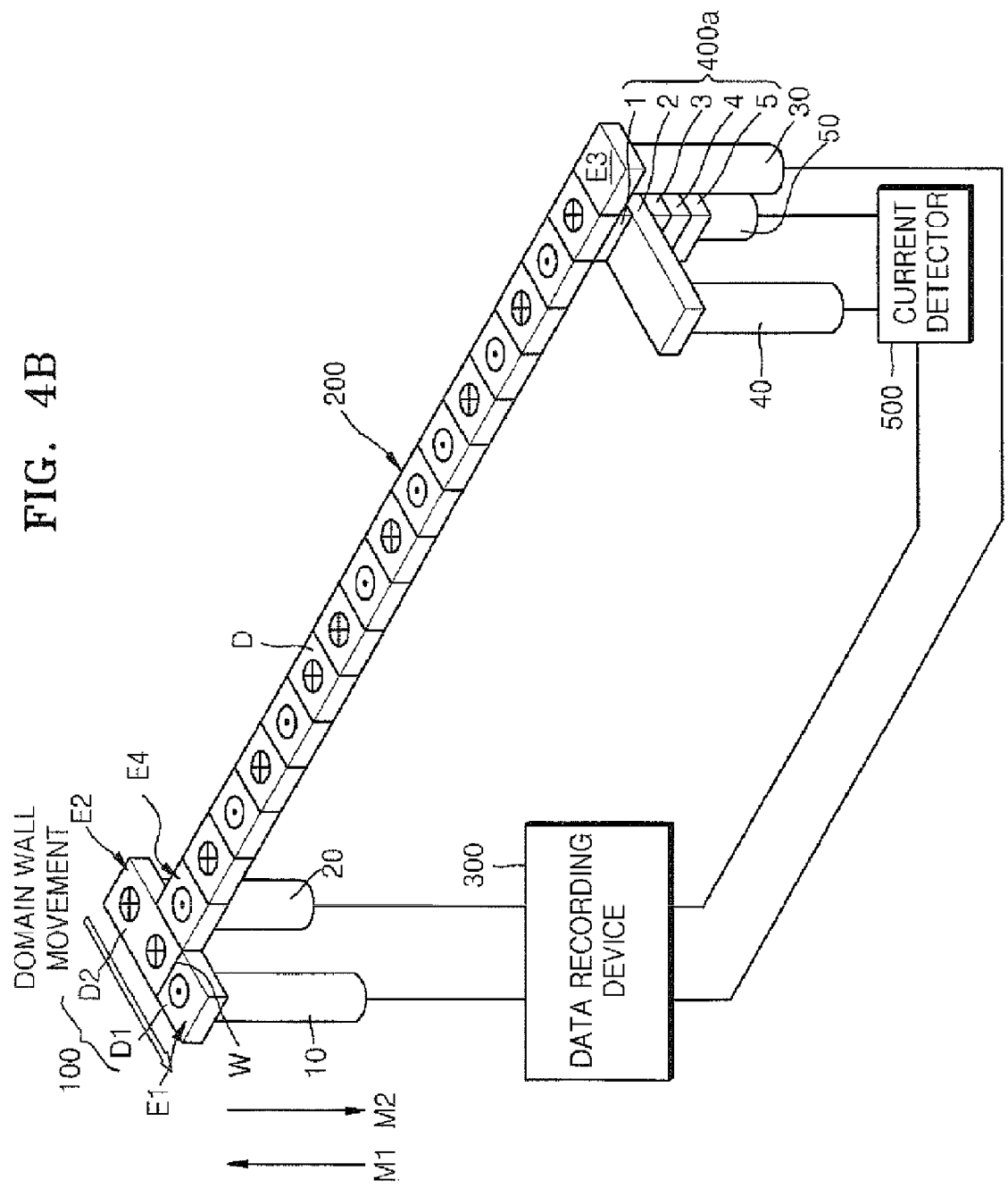

Referring to FIG. 4B, using a data recording device 300 which receives information about read data, a current is supplied between both ends of a first magnetic layer 100, and then a magnetic domain wall 'W' of the first magnetic layer 100 is moved in a predetermined direction, for example, in a direction from the end E2 to the end E1 of the first magnetic layer 100. Accordingly, the magnetization direction of the part of the first magnetic layer 100 which contacts the second magnetic layer 200 is the ⊗ magnetization direction.

Figure 4C:
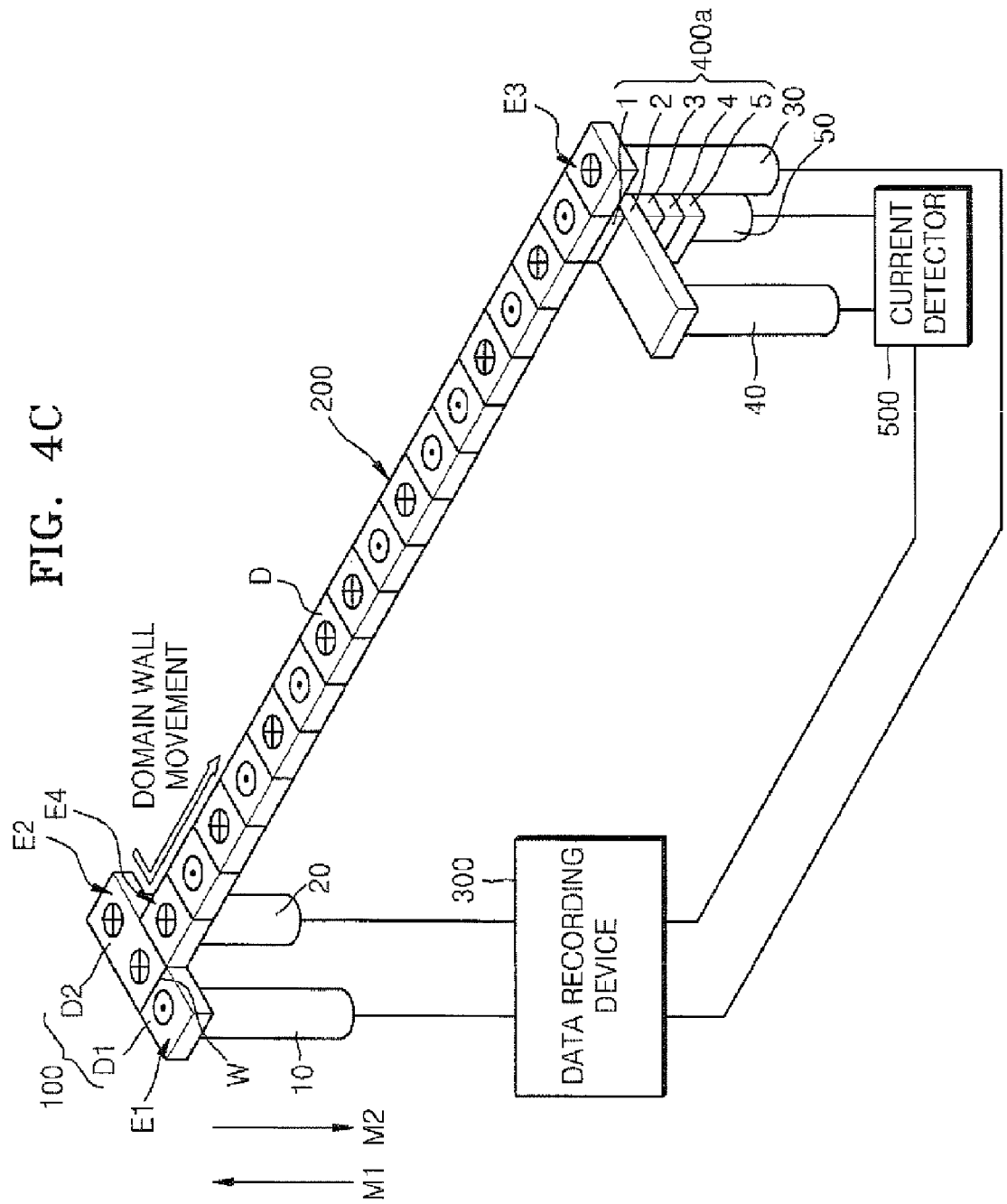

Referring to FIG. 4C, using the data recording device 300 which receives the information about the read data, a current is supplied between the end E2 of the first magnetic layer 100 and the end E3 of the second magnetic layer 200, and then a magnetic domain of the part of the first magnetic layer 100 which contacts the second magnetic layer 200 extends into the end E4 of the second magnetic layer 200 by a length of one bit.

When the data read by the read head 400a is transcribed to the end E4 of the second magnetic layer 200, the magnetic domain walls of the second magnetic layer 200 are moved one unit from the end E4 to the end E3 of the second magnetic layer 200. By repeating such reading and transcribing of magnetic domains, when the magnetic domain wall of the second magnetic layer 200 is moved from the end E4 to the end E3, all data recorded in the second magnetic layer 200 can be read. The content of the data recorded in the second magnetic layer 200 is the same before and after the reading operation.

Although not illustrated, a writing operation, in which new data is recorded in the first data storage device, is basically the same as the writing operation described referring to FIGS. 2A through 2D. Here, when the reading operation is not performed, and the magnetic domain walls of the first and second magnetic layers 100 and 200 are moved using the data recording device 300, predetermined data can be recorded in the second magnetic layer 200.

FIG. 5 illustrates a data storage device in which various elements are connected to the structure of FIG. 1, according to another embodiment of the present invention.

FIG. 5 is a perspective view illustrating a data storage device including a read head and a data recording device (hereinafter, referred to as 'second data storage device'), according to another embodiment of the present invention. The second data storage device includes the data storage device illustrated in FIG. 1 but further includes several other elements, and is an improvement of the first data storage device illustrated in FIG. 3. Like reference numerals in FIGS. 1, 3 and 5 denote like elements, and thus their description will be omitted. The great difference between the first and second data storage devices respectively illustrated in FIGS. 3 and 5, is the structure of the read head.

Referring to FIG. 5, the second data storage device includes a read head 400b which comprises a ferromagnetic free layer 6, a separation layer 7 and a ferromagnetic pinned layer 8 which are sequentially formed on a lower surface of the second magnetic layer 200. A sixth contact plug 60 is formed on a lower surface of the ferromagnetic pinned layer 8. The separation layer 7 may be an insulating layer or a conductive layer, preferably, an insulating layer. Stack layers such as the ferromagnetic free layer 6, the separation layer 7 and the ferromagnetic pinned layer 8 are formed to have the same width as that of a single magnetic domain of the second magnetic layer 200. Although not illustrated, an AFM layer and an electrode layer, or alternately, a non-magnetic layer, a ferromagnetic pinned layer, an AFM layer and an electrode layer may additionally be sequentially disposed below the ferromagnetic pinned layer 8.

A third contact plug 30 may be formed on a lower surface of the end E3 of the second magnetic layer 200, and the third contact plug 30 and the sixth contact plug 60 may be connected to a current detector 500. Switching devices, in the current embodiment first and second transistors T1 and T2, may be respectively disposed between the end E3 of the second magnetic layer 200 and the current detector 500, and between the end E3 of the second magnetic layer 200 and the data recording device 300.

Figure 6A:
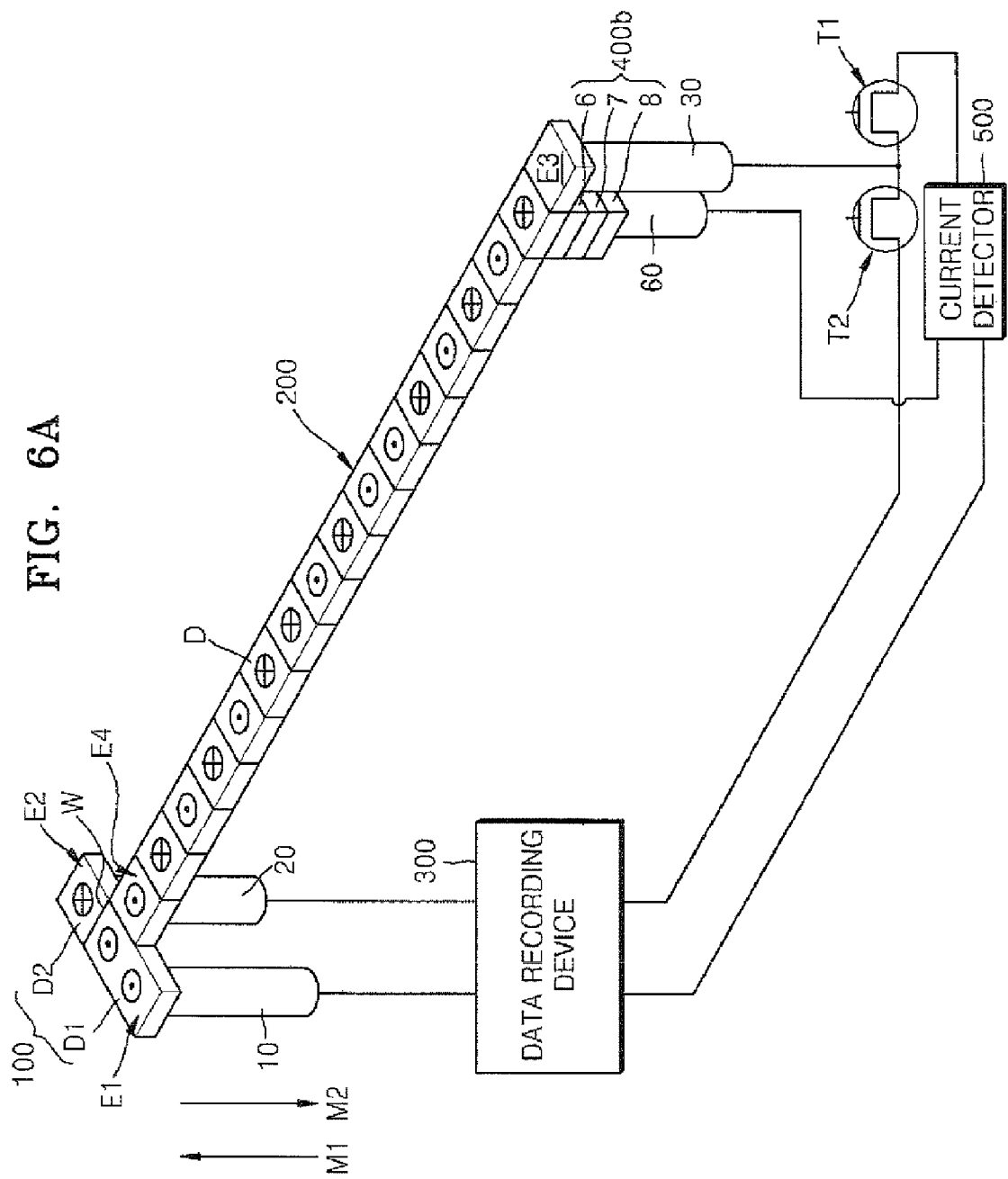

Hereinafter, referring to FIGS. 6A through 6C, a reading operation of the data storage device of FIG. 5 will be described. Referring to FIG. 6A, after predetermined data is recorded in the second magnetic layer 200, data recorded in a magnetic domain of the second magnetic layer 200 can be read. For example, in FIG. 6A, a magnetic domain having the ⊗magnetization direction is read using the read head 400b and the current detector 500. Such a reading operation is performed when only the first transistor T1 of first and second transistors T1 and T2 is turned on. Information about the read data is input to the data recording device 300.

Figure 6B:
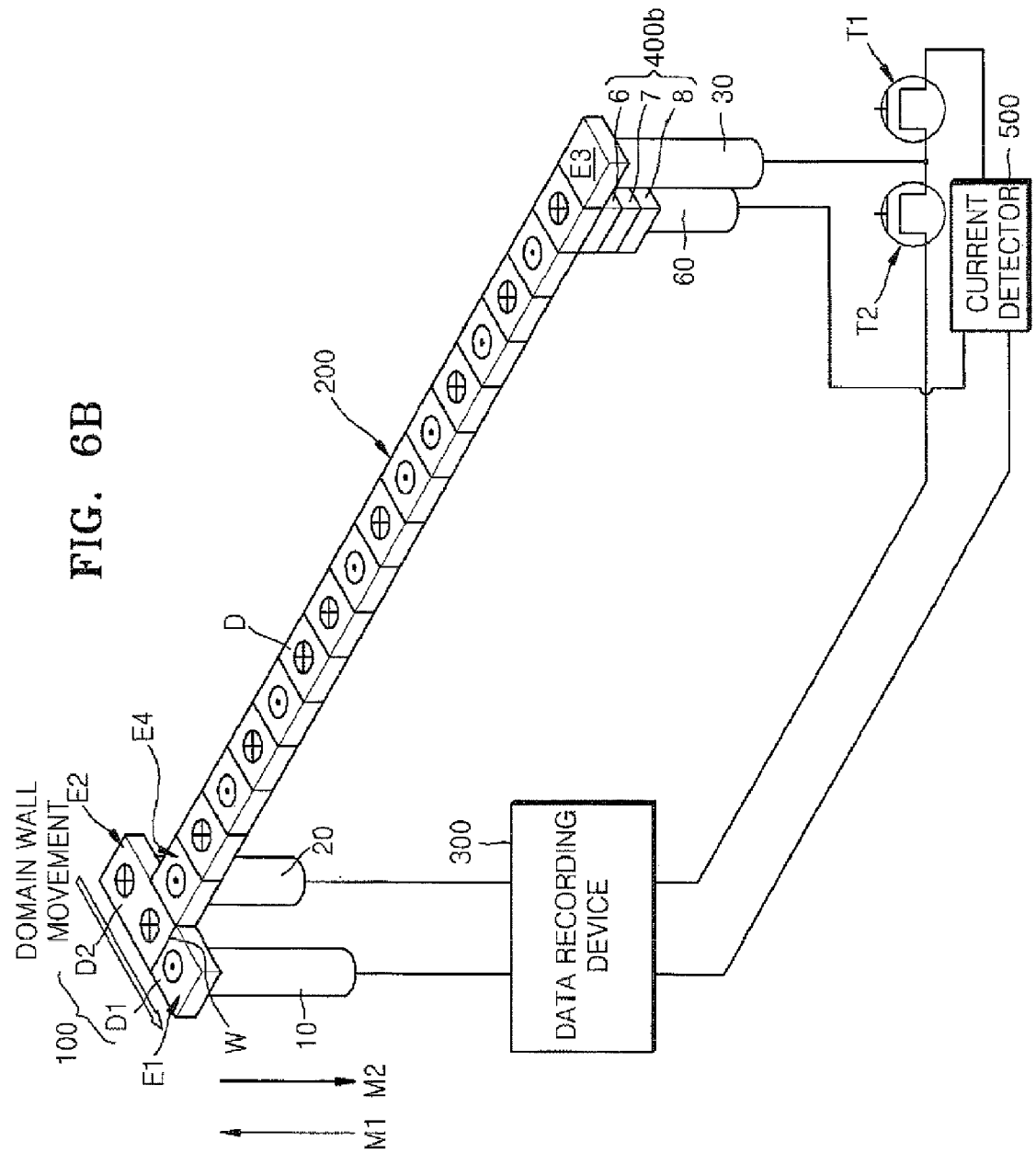

Referring to FIG. 6B, when the first transistor T1 is turned off, and the second transistor T2 is turned on, using the data recording device 300 which receives information about the read data, a current is supplied between both ends of the first magnetic layer 100 and then magnetic domain wall 'W' of the first magnetic layer 100 is moved in a predetermined direction, for example, in a direction from the end E2 to the end E1 of the first magnetic layer 100. Accordingly, the magnetization direction of the part of the first magnetic layer 100 which contacts the second magnetic layer 200, is the ⊗ magnetization direction which is the same direction as the magnetic domain which has just been read.

Referring to FIG. 6C, using the data recording device 300 which receives the information about the read data, a current is supplied between one of the ends of the first magnetic layer 100, in this case the other end E2 of the first magnetic layer 100, and the end E3 of the second magnetic layer 200, and then a magnetic domain of the part of the first magnetic layer 100 which contacts the second magnetic layer 200, extends into the end E4 of the second magnetic layer 200 by a length of one bit.

Similar to FIGS. 4A through 4C, when the data read in the read head 400b is transcribed at the other end E4 of the second magnetic layer 200, the magnetic domain walls of the second magnetic layer 200 are moved from the end E4 towards the end E3 of the second magnetic layer 200 by one unit bit. By repeating such reading and transcribing, when the magnetic domain walls of the second magnetic layer 200 are moved from the end E4 to the end E3 of the second magnetic layer 200, all data recorded in the second magnetic layer 200 can be read. The content of the data recorded in the second magnetic layer 200 is the same before and after the reading operation.

Although not illustrated, a writing operation, in which new data is recorded in the second data storage device, is basically the same as the writing operation described referring to FIGS. 2A through 2D. At this time, when the reading operation is not performed, only the transistor T2 of the first and second transistors T1 and T2 is turned on, and the magnetic domain walls of the first and second magnetic layers 100 and 200 are moved using the data recording device 300, predetermined data can be recorded in the second magnetic layer 200.

Figure 7:
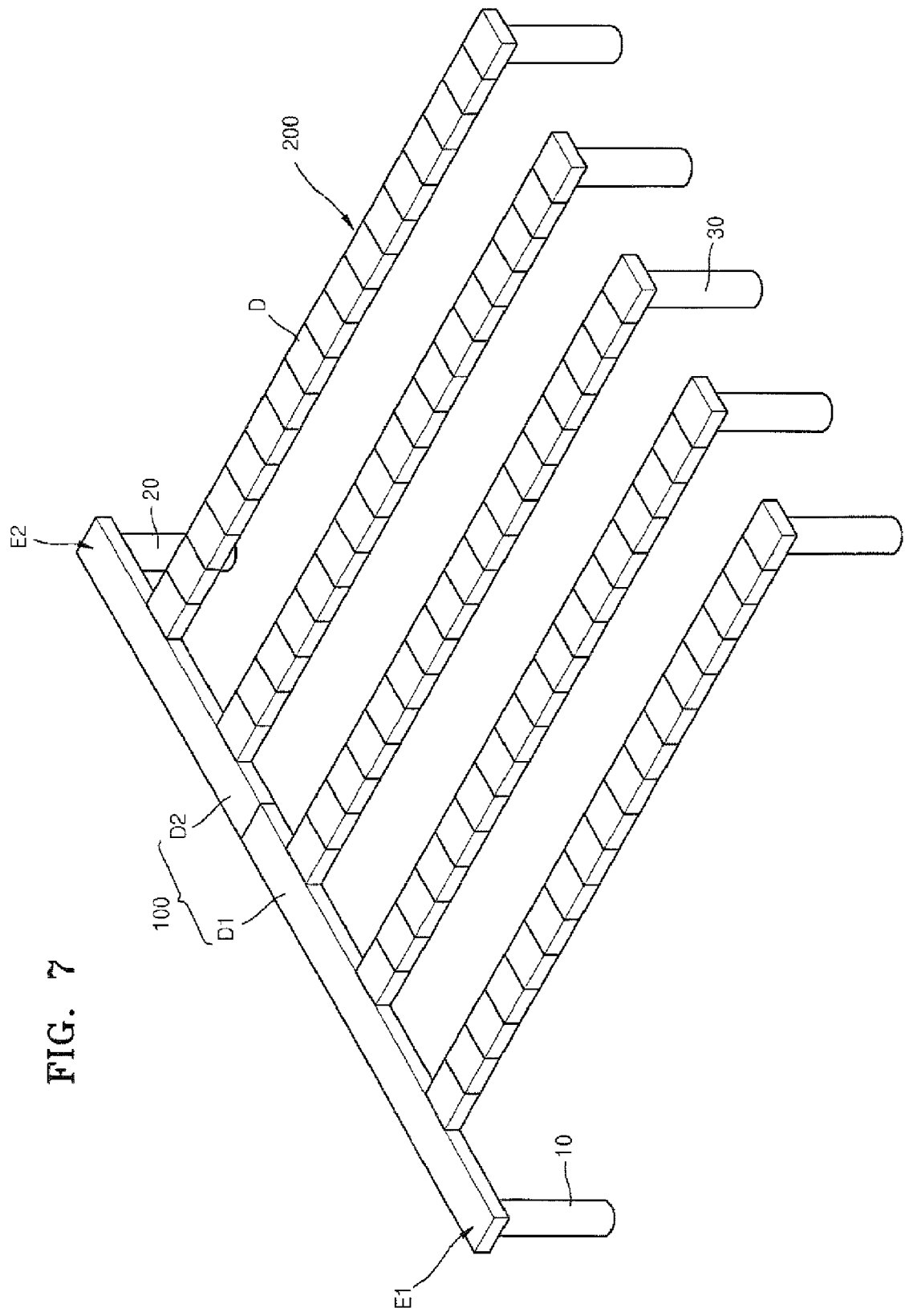
FIGS. 7 and 8 are perspective views illustrating data storage devices according to embodiments of the present invention.
Figure 8:
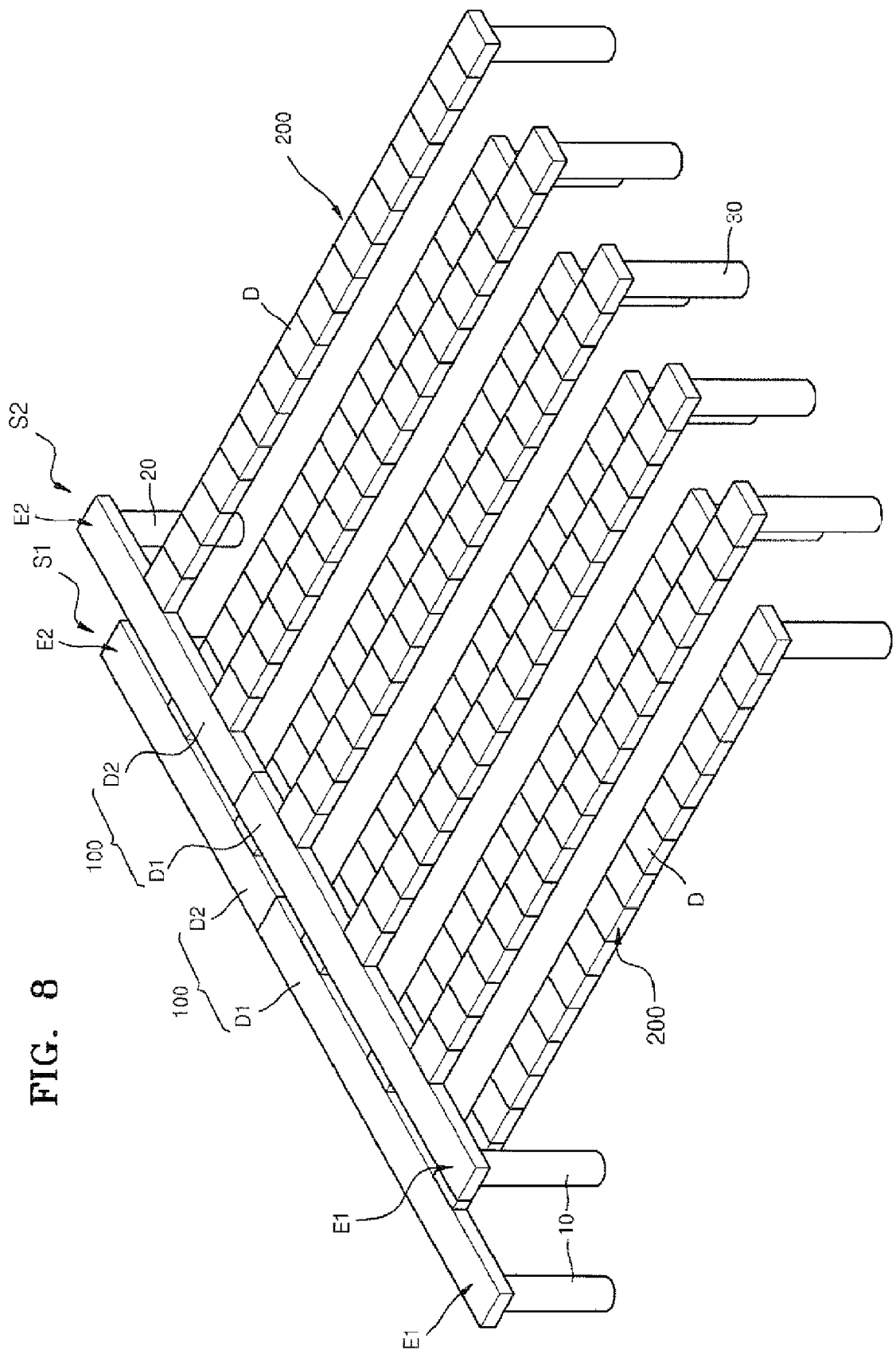

As described above, according to the above embodiments, the case, where one second magnetic layer 200 is employed, has been illustrated and described for convenience of explanation. Preferably, a plurality of second magnetic layers may be spaced at regular intervals on at least one side of the first magnetic layer 100. FIGS. 7 and 8 illustrate the case where a plurality of second magnetic layers 200 are formed. Referring to FIG. 8, first and second structures S1 and S2 including a first magnetic layer 100 and the plurality of second magnetic layers 200 are stacked so that second magnetic layers 200 of the second structure S2 may be disposed on upper parts between second magnetic layers 200 of the first structure S1, respectively. In such case, a degree of integration can be improved. Both of the data storage devices of FIGS. 7 and 8 may further include the data recording device 300, the read heads 400a and 400b and the current detector 500 similar to the first and second data storage devices of FIGS. 3 and 5. In the data storage devices of FIGS. 7 and 8, the first magnetic layer 100 is a common writing means for recording data in a plurality of second magnetic layers 200. That is, a current is supplied between one end E1 and the other end E2 of the first magnetic layer 100, and then a magnetic domain wall 'W' is moved to a desired location. Thus, desired data can be recorded in specified one of the second magnetic layers 200.

As described above, in the data storage device, a conventional giant magneto resistance (GMR) write head or a tunnel magneto resistance (TMR) write head is not used as a writing means, but the first magnetic layer 100 is instead used, wherein the first magnetic layer 100 is formed on the same layer as the second magnetic layer 200. In addition, data can be recorded in the second magnetic layer 200 by appropriately moving magnetic domain walls. Accordingly, the data storage device is not limited by the properties and the dimensions of the magnetic layer in which data is to be recorded. In addition, the operation characteristics of the data storage device are fundamentally prevented from deteriorating due to damage to a separation layer of a conventional GMR write head or TMR write head. In particular, in the data storage device, since the first and second magnetic layers 100 and 200 are formed on the same layer and the first magnetic layer 100 is used as a common writing means, the writing means can be fabricated by using a much easier method than in the conventional art.

Although the read heads 400a and 400b of the data storage device are stack structures using a TMR or a GMR effect, a surface of a separation layer in case of the read heads 400a and 400b may not be damaged due to a ferromagnetic free layer and a ferromagnetic pinned layer which are disposed on a upper and lower surfaces of the separation layer, respectively, during etching. As such, there is little problem if the separation layer is damaged, since a damaged separation layer may not influence a reading operation.

For reference, a method of forming the first magnetic layer 100 will be described.

Although the first magnetic layer 100 is simplified in the above embodiments of the present invention, a structure of the first magnetic layer 100 may be somewhat altered or elements of the first magnetic layer 100 may be multiplied in order to form first and second magnetic domains D1 and D2 in the first magnetic layer 100. For example, at least one of ends E1 and E2 of the first magnetic layer 100 may be formed so as to have a greater width than that of regions other than the ends E1 and E2. The further from the center of the first magnetic layer 100, the greater the width of at least one of ends E1 and E2 of the first magnetic layer 100. The ends E1 and E2 may be formed to have different sizes. An AFM layer may be further formed on the end E1, or first and second AFM layers having different Neel temperatures $T_N$s may be formed on the end E1 and the end E2, respectively. Lastly, a nonmagnetic layer, a ferromagnetic pinned layer and a first AFM layer may be further sequentially formed on the end E1, and a second AFM layer may be further formed on the end E2.

Figure 9A:
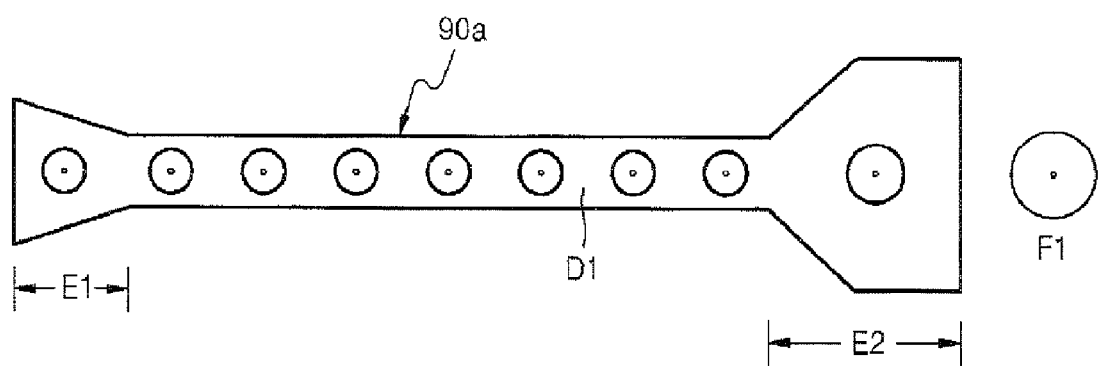
FIGS. 9A and 9B are plane views illustrating a method of forming a first magnetic layer, according to an embodiment of the present invention.
Figure 9B:
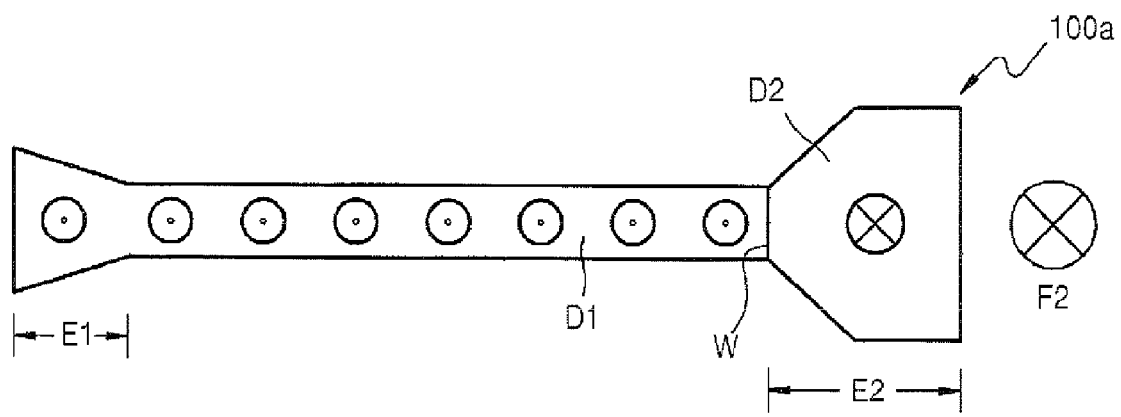

FIGS. 9A and 9B are plane views illustrating a method of forming a first magnetic layer, according to an embodiment of the present invention.

Referring to FIG. 9A, in order to form the first magnetic layer according to the current embodiment of the present invention, a magnetic layer 90a, which is a main material for forming the first magnetic layer, is formed so as to have ends E1 and E2 having greater widths than other regions of the magnetic layer 90a, and satisfy the condition where the further from the center of the magnetic layer 90a, the greater the width of the magnetic layer 90a. The size of the end E2 is greater than that of the end E1. When the magnetic layer 90a is formed, a first external magnetic field F1 is applied to the magnetic layer 90a, and a first magnetic domain D1, which is magnetized in a first direction, is formed in the magnetic layer 90a.

Referring to FIG. 9B, a second external magnetic field F2, having an opposite magnetization direction to that of the first external magnetic field F1 and a smaller intensity than that of the first external magnetic field F1, is applied to the magnetic layer 90a. A second magnetic domain D2, which is magnetized in a second direction opposite to the first direction, is formed in the end E2. A magnetic domain wall 'W' exists between the first and second magnetic domains D1 and D2. Accordingly, the first magnetic layer 100a including the first and second magnetic domains D1 and D2 is formed. The second magnetic domain D2 is formed in only the end E2 since the other end E2 is larger than the end E1, and thus the magnetization reversal in the end E2 is easier than that in the end E1.

When the magnetic domain wall 'W' is moved from the end E2 to the end E1, the movement distance of the magnetic domain wall 'W' can be controlled according to the magnitude of a current which is supplied to the first magnetic layer 100a, and the magnetic domain wall 'W' does not go inside the end E1. Since the end E1 is greater than the regions of the first magnetic layer 100a other than the end E2, and the further from the center of the first magnetic layer 100a, the greater the width of the first magnetic layer 100a, the current density in the end E1 is reduced. For the same reason, when the magnetic domain wall 'W' is moved from the end E1 to the end E2, the magnetic domain wall 'W' can be prevented from going inside the end E2. Accordingly, the first and second magnetic domains D1 and D2 can be prevented from disappearing.

In the method of forming the first magnetic layer 100a, since only the shapes of the end E1 and the end E2 are controlled, and additional layers are not required, the first and second magnetic layers 100a and 200 can be formed by a single thin film process.

Figure 10A:
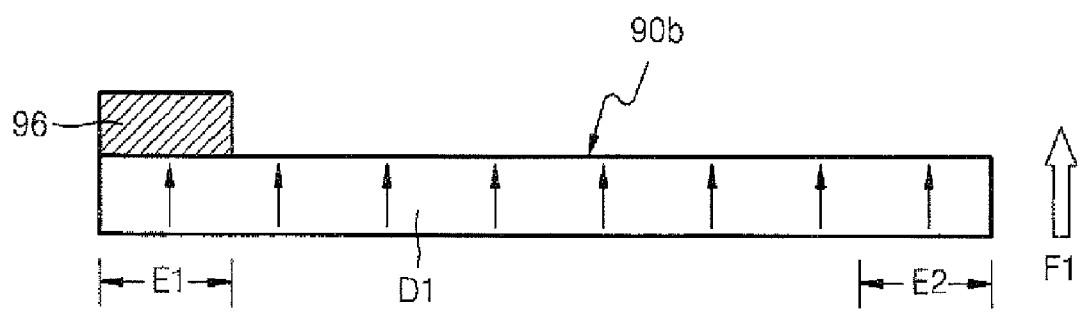
FIGS. 10A and 10B are cross-sectional views illustrating a method of forming a first magnetic layer, according to another embodiment of the present invention.
Figure 10B:
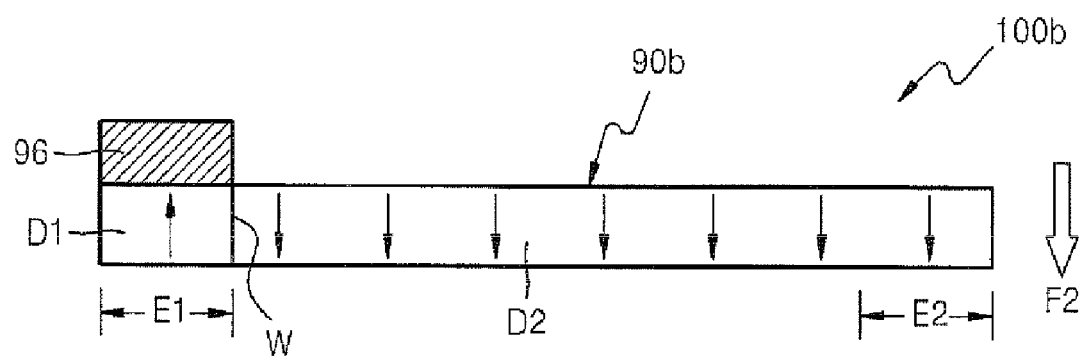

FIGS. 10A and 10B are cross-sectional views illustrating a method of forming a first magnetic layer, according to another embodiment of the present invention.

Referring to FIG. 10A, in order to form the first magnetic layer according to the current embodiment of the present invention, an AFM layer 96 is formed on one end E1 of a magnetic layer 90b, which is a main material for forming the first magnetic layer according to the current embodiment of the present invention. When the magnetic layer 90b and the AFM layer 96 are heated to more than $T_N$ of the AFM layer 96, a first external magnetic field F1 is applied to the magnetic layer 90b, a first magnetic domain D1 having a first direction as a magnetization direction is formed in the magnetic layer 90b. The magnetization direction of a lower part of the AFM layer 96, that is, the end E1 is fixed by the AFM layer 96.

Referring to FIG. 10B, the magnetic layer 90b and the AFM layer 96 are cooled, and a second external magnetic field F2 having an opposite magnetization direction to that of the first external magnetic field F1 is applied to the magnetic layer 90b. Accordingly, a second magnetic domain D2, which is magnetized in a second direction opposite to the first direction, is formed in regions other than the one end E1 of the magnetic layer 90b. A magnetic domain wall 'W' exists between the first and second magnetic domains D1 and D2, and a first magnetic layer 100b including the first and second magnetic domains D1 and D2 is formed.

Figure 11A:
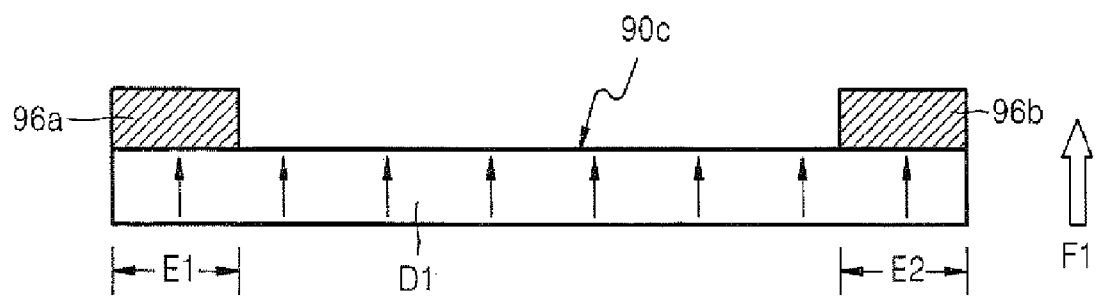
FIGS. 11A and 11B are cross-sectional views illustrating a method of forming a first magnetic layer, according to another embodiment of the present invention.
Figure 11B:
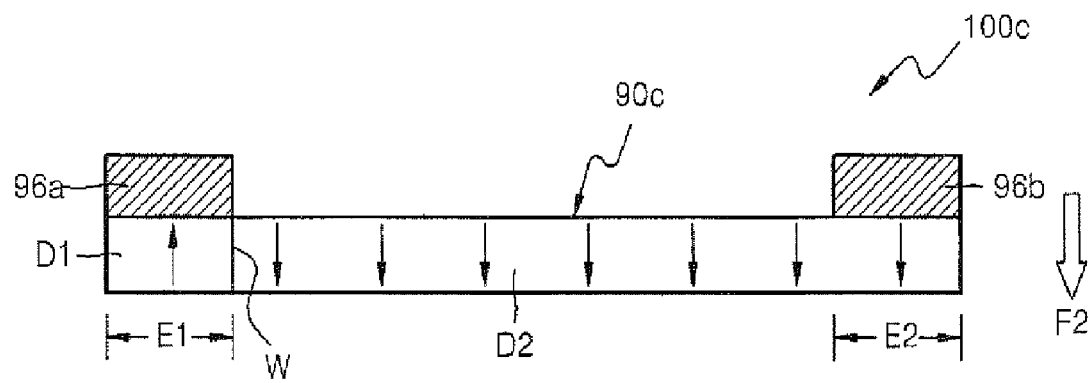

FIGS. 11A and 11B are cross-sectional views illustrating a first magnetic layer, according to another embodiment of the present invention.

Referring to FIG. 11A, in order to form the first magnetic layer according to the current embodiment of the present invention, first and second layers 96a and 96b having different $T_N$s are respectively formed on one end E1 and the other end E2 of a magnetic layer 90c, which is a main material for forming the first magnetic layer according to the current embodiment of the present invention. For example, the $T_N$ of the first AFM layer 96a may be 300° C., and the $T_N$ of the second AFM layer 96b may be 200° C. When the magnetic layer 90c and the first and second AFM layers 96a and 96b are heated to more than 300° C., a first external magnetic field F1 is applied to the magnetic layer 90c, and then a first magnetic domain D1 is formed in the magnetic layer 90c having a magnetization direction in a first direction.

Referring to FIG. 11B, when the temperatures of the magnetic layer 90b and the first and second AFM layers 96a and 96b are controlled to be in the range of 200 to 300° C., a second external magnetic field F2 having an magnetization direction opposite to that of the first external magnetic field F1 is applied to the magnetic layer 90c. Accordingly, a second magnetic domain D2, which has a magnetization direction in a second direction opposite to the first direction, is formed in regions other than the end E1 of the magnetic layer 90c. A magnetic domain wall 'W' exists between the first and second magnetic domains D1 and D2. The magnetization direction of the end E1 below the first AFM layer 96a is not changed since a heating temperature is not over 300° C. The magnetization direction of the end E2 below the second AFM layer 96b is changed since a heating temperature is over 200° C. Accordingly, a first magnetic layer 100c including the first and second magnetic domains D1 and D2 is formed.

Figure 12:
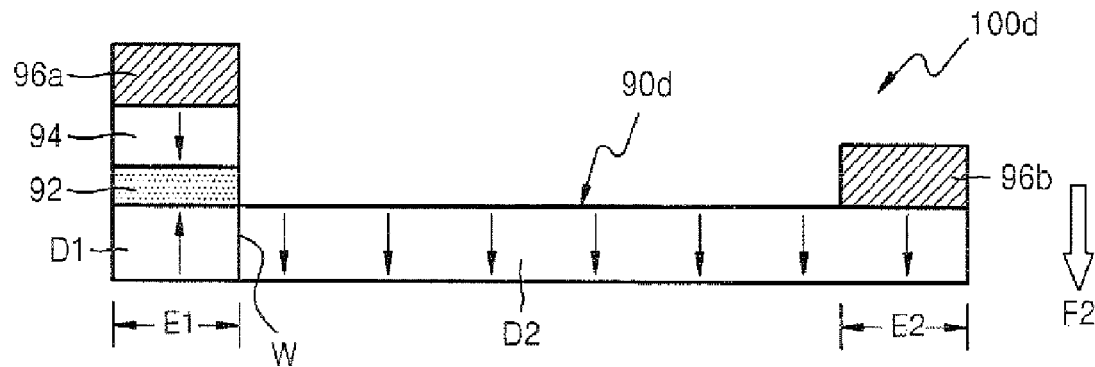
FIG. 12 is a cross-sectional view illustrating a method of forming a first magnetic layer, according to another embodiment of the present invention.

FIG. 12 is a cross-sectional view illustrating a method of forming a first magnetic layer, according to another embodiment of the present invention.

Referring to FIG. 12, a non-magnetic layer 92, a ferromagnetic pinned layer 94 and a first AFM layer 96a are sequentially formed on one end E1 of a magnetic layer 90d which is the main material for forming the first magnetic layer according to the current embodiment of the present invention, and a second AFM layer 96b is formed on the other end E2 of the magnetic layer 90d. The $T_N$s of the first and second AFM layers 96a and 96b may be the same. When the magnetic layer 90d, the first and second AFM layer 96a and 96b, etc. are heated to more than $T_N$, a second external magnetic field F2 is applied to the magnetic layer 90d, and a second magnetic domain D2 having a second direction as a magnetization direction is formed in regions other than the end E1 of the magnetic layer 90d. The magnetization direction of the ferromagnetic pinned layer 94 below the first AFM layer 96a is fixed to the second direction, and the magnetization of the end E1 is fixed in a first direction which is opposite to the second direction. That is, a first magnetic domain D1, which is magnetized in the first direction, is formed in the end E1. Accordingly, a first magnetic layer 100d including the first and second magnetic domains D1 and D2 is formed.

In the methods of forming the first magnetic layer according to the embodiment of the present invention, additional layers may be formed on both ends or one end of the first magnetic layer, but the additional layers take part in fixing the first magnetic layer to a specified magnetization direction rather than deteriorating the writing operation property. Since the first magnetic layer is used as a common writing means, and the additional layers are formed on both ends or one end of the first magnetic layer, there is no difficulty in forming the additional layers.

As described above, in the data storage device, the first magnetic layer 100 is used as a writing means, wherein the first magnetic layer 100 is formed on a layer on which the second magnetic layer 200, in which data is to be stored, is formed, and data is recorded by appropriately moving a magnetic domain wall in first and second magnetic layers 100 and 200. Accordingly, the data storage device is not limited by the property and the dimension of the magnetic layer in which data is to be recorded. In addition, the operating characteristics of the data storage device are fundamentally prevented from deteriorating due to a separation layer becoming damaged in a conventional GMR write head or TMR write head.

In the data storage device, since the first and second magnetic layers 100 and 200 are formed on the same layer, and the first magnetic layer 100 is used as a common writing means, a writing means can be more easily fabricated than a conventional art, and the numbers of contact plugs and devices, which are formed so as to be connected to the writing means, can be reduced in respect of the conventional art. Accordingly, the data storage device has a higher degree of integration and capacity than a conventional data storage device.

While the present invention has been particularly shown, it will be understood by those of ordinary skill in the art that the above descriptions are exemplary embodiments of the present invention. For example, it will be understood by those of ordinary skill in the art that various changes in elements of the data storage device of the present invention may be made. In particular, the read head of the data storage head may have various structures such as a current perpendicular to plane (CPP)-TMR, a CPP-GMR, a current in plane (CIP)-GMR or the like. Although the first and second magnetic layers 100 and 200 have perpendicular magnetic anisotropy according to the current embodiment of the present invention, the present invention is not limited thereto. That is, the first and second magnetic layers 100 and 200 may have horizontal magnetic anisotropy. While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A data storage device comprising:
   a first magnetic layer which writes data, the first magnetic layer comprising two magnetic domains magnetized in opposite directions to each other; and
   a second magnetic layer which stores data, the second magnetic layer being formed on at least one side of the first magnetic layer; wherein
   the first magnetic layer includes a portion that is connected to the second magnetic layer, and has a structure that extends from both sides of the portion, and
   the data is written to the second magnetic layer by applying a current passing through the first and second magnetic layers.

2. The data storage device of claim 1, further comprising:
   a data recording device connected to both ends of the first magnetic layer and an end of the second magnetic layer which is not adjacent to the first magnetic layer;
   a read head disposed a predetermined distance from the end of the second magnetic layer which is not adjacent to the first magnetic layer; and
   a current detector connected to the read head and the data recording device.

3. The data storage device of claim 2, wherein the read head comprises an insulating head layer, an electrode layer, a ferromagnetic free layer, a separation layer and a ferromagnetic pinned layer which are sequentially disposed on a lower surface of the second magnetic layer.

4. The data storage device of claim 3, wherein the electrode layer and the ferromagnetic pinned layer are connected to the current detector.

5. The data storage device of claim 2, wherein the read head comprises a ferromagnetic free layer, a separation layer and a ferromagnetic pinned layer which are sequentially disposed on a lower surface of the second magnetic layer.

6. The data storage device of claim 5, wherein the ferromagnetic pinned layer and the end of the second magnetic layer are connected to the current detector.

7. The data storage device of claim 6, wherein a switching device is disposed between the end of the second magnetic layer and the current detector and between the end of the second magnetic layer and the data recording device.

8. The data storage device of claim 2, wherein the data recording device comprises a current controller.

9. The data storage device of claim 2, wherein the data recording device comprises a voltage controller.

10. The data storage device of claim 1, wherein a plurality of second magnetic layers are disposed at regular intervals.

11. The data storage device of claim 1, wherein a plurality of first magnetic layers are formed having a stacked structure and each of the plurality of first magnetic layers has a plurality of second magnetic layers disposed thereon.

12. The data storage device of claim 1, wherein the first and second magnetic layers are disposed of the same material.

13. The data storage device of claim 1, wherein the first magnetic layer satisfies the condition of the farther from the center of the first magnetic layer, the greater the width of at least one of the ends of the first magnetic layer.

14. The data storage device of claim 1, wherein one of the ends of the first magnetic layer has a greater width than the remaining region except for the ends of the first magnetic layer.

15. The data storage device of claim 13, wherein the ends of the first magnetic layer have different sizes.

16. The data storage device of claim 14, wherein the ends of the first magnetic layer have different sizes.

17. The data storage device of claim 1, further comprising:
   an anti-ferromagnetic (AFM) layer disposed on one end of the first magnetic layer.

18. The data storage device of claim 1, further comprising:
   first and second AFM layers formed on either end of the first magnetic layer and having different Neel temperatures $T_N^S$.

19. The data storage device of claim 1, further comprising:
   a non-magnetic layer, a ferromagnetic pinned layer and a first AFM layer which are sequentially disposed on an end of the first magnetic layer, and a second AFM layer disposed on the other end of the first magnetic layer.

20. A method of operating a data storage device, wherein the data storage device includes,
   a first magnetic layer which writes data, the first magnetic layer comprising two magnetic domains magnetized in opposite directions to each other, and
   a second magnetic layer which stores data, the second magnetic layer being formed on at least one side of the first magnetic layer,
   wherein the first magnetic layer includes a portion that is connected to the second magnetic layer, and has a structure that extends from both sides of the portion, and
   wherein the data is written to the second magnetic layer by applying a current passing through the first and second magnetic layers, the method comprising:
   extending one of the magnetic domains of the first magnetic layer into a part of the first magnetic layer which contacts the second magnetic layer; and
   moving the magnetic domain of the part of the first magnetic layer which contacts the second magnetic layer, into the second magnetic layer by a distance which corresponds to a length of one bit.

21. The method of claim 20, wherein the extending is performed by flowing a current between both ends of the first magnetic layer, and the moving is performed by flowing a current from the second magnetic layer to the first magnetic layer.

22. A method of operating a data storage device, the data storage device including,
   a first magnetic layer which writes data, the first magnetic layer comprising two magnetic domains magnetized in opposite directions to each other, and a second magnetic layer which stores data, the second magnetic layer being formed on at least one side of the first magnetic layer, a data recording device connected to both ends of the first magnetic layer and an end of the second magnetic layer which is not adjacent to the first magnetic layer, a read head disposed a predetermined distance from the end of the second magnetic layer which is not adjacent to the first magnetic layer, and a current detector connected to the read head and the data recording device, wherein the first magnetic layer includes a portion that is connected to the second magnetic layer, and has a structure that extends from both sides of the portion, and wherein the data is written to the second magnetic layer by applying a current passing through the first and second magnetic layers, the method comprising:

reading data recorded at an end of the second magnetic layer which is not adjacent to the first magnetic layer using the read head and the current detector; and recording data read in the reading of the data at another end of the second magnetic layer using the data recording device.

23. The method of claim 22, wherein the recording comprises:

extending one of the magnetic domains of the first magnetic layer to a part of the first magnetic layer which contacts the second magnetic layer; and moving a magnetic domain of the part of the first magnetic layer which contacts the second magnetic layer, into the second magnetic layer by a distance which corresponds to a length of one bit.

* * * * *